United States Patent [19]

Delman

[11] Patent Number: 4,513,440
[45] Date of Patent: Apr. 23, 1985

[54] HARDWARE MEDIAN FILTER

[75] Inventor: Dennis J. Delman, Indialantic, Fla.

[73] Assignee: Harris Corporation, Melbourne, Fla.

[21] Appl. No.: 393,331

[22] Filed: Jun. 29, 1982

[51] Int. Cl.³ .................. G06K 9/00; G06F 7/06; G06F 9/64

[52] U.S. Cl. .................. 382/30; 364/900; 382/34; 382/36; 382/41

[58] Field of Search .................. 364/900; 382/34, 36, 382/30, 41; 358/280, 282, 284, 138, 166

[56] References Cited

U.S. PATENT DOCUMENTS

| | | | |
|---|---|---|---|
| 3,336,580 | 8/1967 | Armstrong | 364/900 |
| 4,110,837 | 8/1978 | Chen | 364/900 |
| 4,295,206 | 10/1981 | Cain et al. | 364/900 |
| 4,334,244 | 6/1982 | Chan et al. | 358/138 |
| 4,410,960 | 10/1983 | Kasuya | 364/900 |
| 4,439,840 | 3/1984 | Coleman et al. | 382/34 |

Primary Examiner—Leo H. Boudreau
Attorney, Agent, or Firm—Antonelli, Terry & Wands

[57] ABSTRACT

A hardware median filter, particularly useful for processing high resolutions imagery data is coupled to a set of line buffers to which pixel data for an image of interest is applied, to define a segment or window within the overall image. This multibit data is then propagated through a set of n-pipelined filter processing sections (where n is the number of bits/pixel). Each section examines a particular bit position of the windowed pixels, the first section examining the most significant bit, while the final section examines the least significant bit. Each section contains a set of input registers which store M pixel-data values that have been coupled to it from the previous section. Each respective section contains a majority decision circuit that looks at a particular bit position and decides which bit (zero or one) represents the majority. As a result of this decision, the data bits of the stored pixel-data are either transferred, as is, to the next downstream section, or they are converted to all ones or all zeroes, and that converted data value is passed on to the next section, while the bit value that was determined to be the majority value for that particular bit position is designated as the corresponding bit of the median value. These determined bits for the median are extracted from each successive section in order to derive an output word representative of the median value of all the pixels in the window.

8 Claims, 7 Drawing Figures

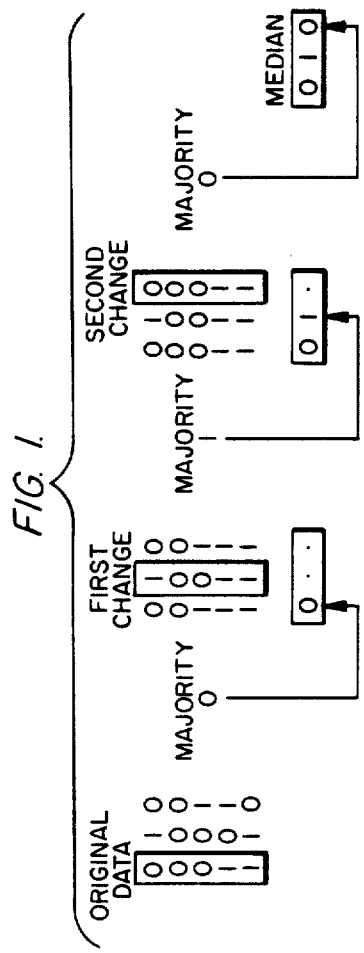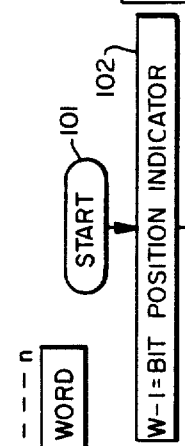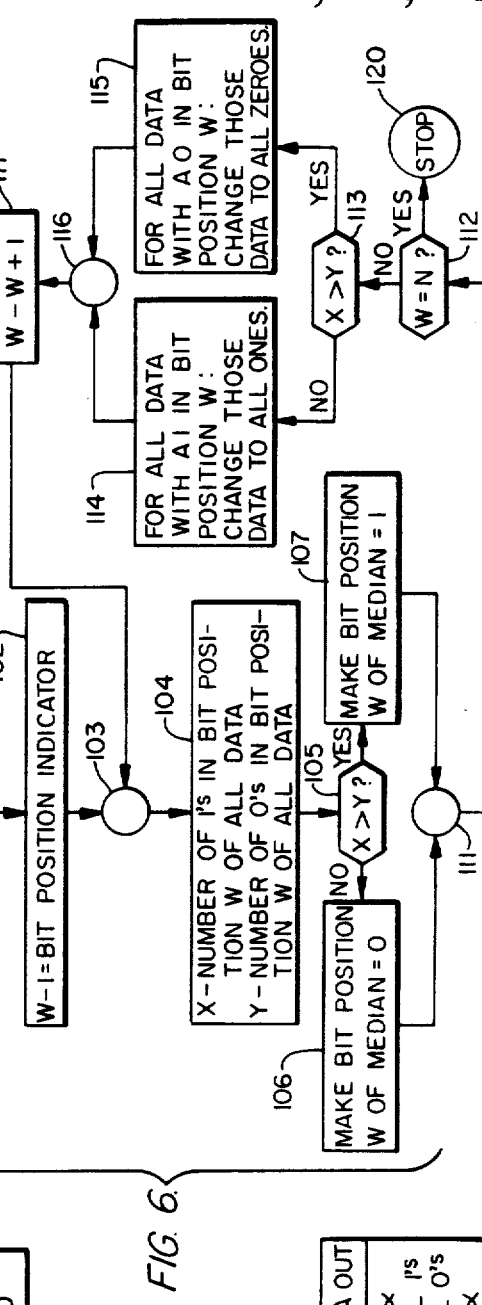

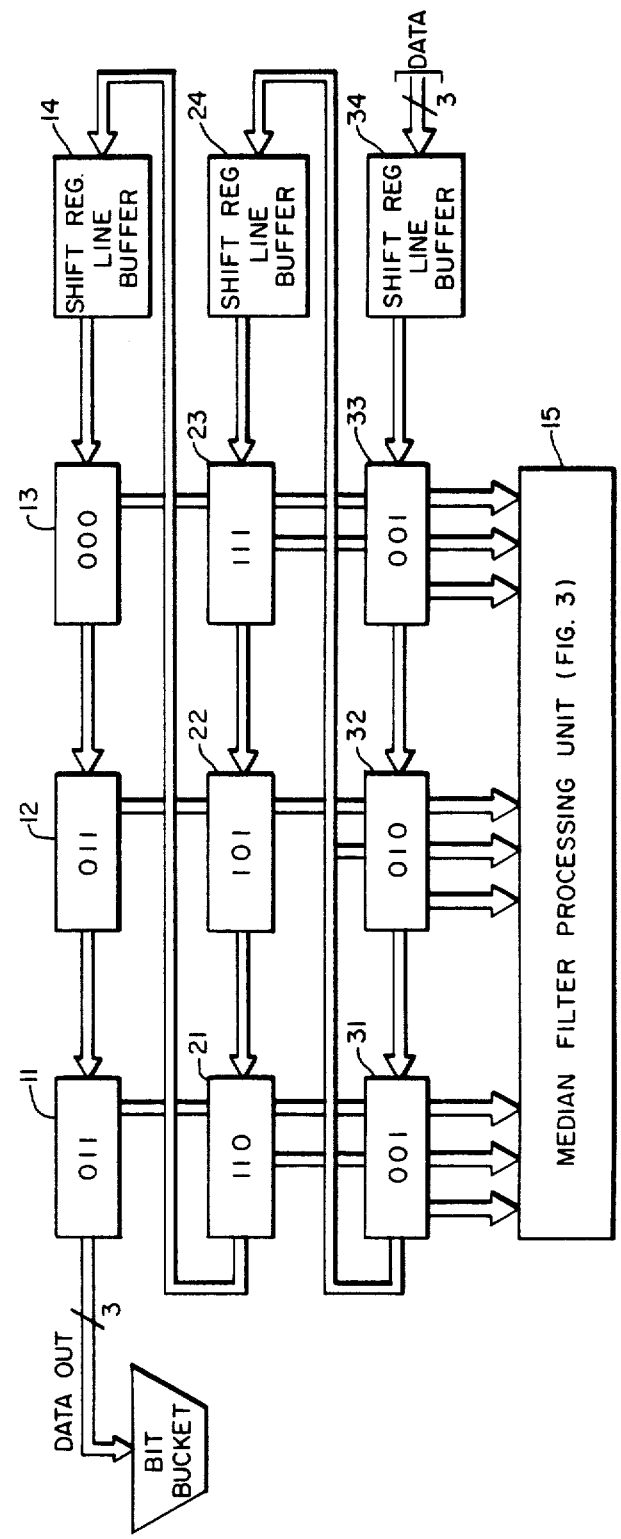

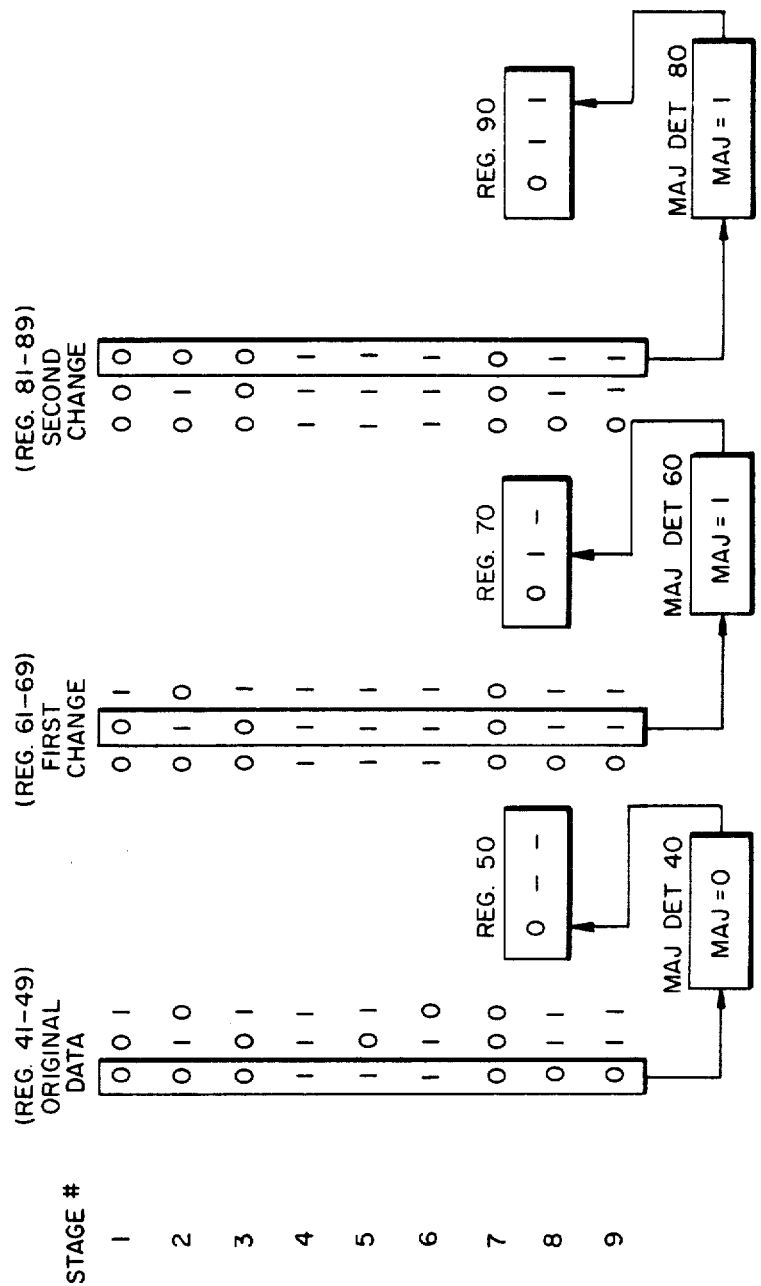

HARDWARE MEDIAN FILTER

FIELD OF THE INVENTION

The present invention relates in general to signal processing systems and is particularly directed to a scheme for obtaining the median value from a set of data values, such as those representative of imagery data.

BACKGROUND OF THE INVENTION

With continuing improvements in the packaging density and speed of operation of electronic data processor circuit components, the application of digital signal processing to a wide variety of signal processing applications has also continued to expand. In multisensor environments, such as those employed for imagery signal generation, statistical signal processing schemes are employed to enhance the electrical signals that are representative of a desired target optical image and to suppress unwanted signals (noise) which represent background clutter. In such target detection systems, large contrast changes are often employed to indicate where to segment potential targets from background. If, in an effort to eliminate noise, a low-pass filter is used for preprocessing, there is a blurring of the edges of potential targets that reduces the sharpness of the contact changes, which could result in a target being missed.

To avoid this problem there have been proposed signal processing systems which employ median filters as a basic tool for target/background separation. The median filter operates to extract a median electrical amplitude value from a set of electrical amplitude values which constitutes an image, or some portion (window) thereof, as viewed by the opto-electronic transducer array of the optical imaging system. Typically, this type of imaging system produces a filter image of the target by eliminating or blanking most electrical noise which has a value significantly different than the median value established by the median filter. Contrasted to the low-pass filter approach referenced above, the median filter preserves image edges while eliminating noise spikes.

Unfortunately, the actual filtering procedure required to implement an exact median filter has been very time consuming. With real-time data rates of $10 \times 10^6$ pixels/sec., it has often been necessary to define a specifically tailored architecture to handle the problem. One-dimensional median filters have been proposed which employ sorter networks comprised of comparators for achieving processing in real-time. The principal motivation for using a separable median filter is that for a small number (n) of inputs (e.g. n=5) the number of comparators is reasonable and the resulting structure of such a two dimensional median filter is not too complex. However, when the number of inputs increases substantially (e.g. n=25), the number of comparators becomes large and the resulting structure is both complex and unmodular.

An example of a system employing a median filter for such a one-dimensional approach is described in the U.S. patent to Bluzer U.S. Pat. No. 4,135,248. This patented system may be used to extract running medians from a data stream in order to remove undesirable noise. To this end the digital input data is converted to base-one coded data, with each data element being entered one at a time in the processing filter. Disadvantageously, because of the use of base-one coded data, the patented system requires extremely large data busses, making it implementationally impractical and therefore unsuitable for handling high resolution multidimensional imagery data.

SUMMARY OF THE INVENTION

In accordance with the present invention, the complexity and impracticality of previously proposed median filters are circumvented by a two-dimensional pipelined exact real-time filtering scheme which is capable of handling a large number of data inputs with a signal processing architecture that is both modular and simple in structure, and can be implemented using conventional "off-the-shelf" components.

More particularly, considering the application of the invention to high resolution data, pixel data for an image of interest is applied to a set of line buffers to define a segment or window within the overall image. This multibit data is then propagated through a set of n-pipelined filter processing sections (where n is the number of bits/pixel). Each section examines a particular bit position of the windowed pixels, the first section examining the most significant bit, while the final section examines the least significant bit. Each section contains a set of input registers which store M pixel-data values that have been coupled to it from the previous section. Each respective section contains a decision circuit that looks at a particular bit position and decides which bit (zero or one) represents the majority. As a result of this decision, the data bits of the stored pixel-data are either transferred, as is, to the next downstream section, or they are converted to all ones or all zeroes, and that converted data value is passed on to the next section, while the bit value that was determined to be the majority value for that particular bit position is designated as the corresponding bit of the median value. These determined bits for the median are extracted from each successive section in order to derive an output word representative of the median value of all the pixels in the window.

DETAILED DESCRIPTION OF THE DRAWINGS

FIG. 1 illustrates an exemplary application of the median filtering technique of the present invention to a set of five, three-bit numbers;

FIG. 2 is a block diagram of a pipelined nine-stage window and associated median filter processing unit according to the present invention;

FIG. 4 is a table showing logical operation of a majority detector of FIG. 3;

FIG. 5 is a table showing the logical operation of a control buffer of FIG. 3;

FIG. 6 is a flow chart detailing the signal processing operation of the median filter according to the present invention; and FIG. 7 illustrates an exemplary embodiment of the median filtering technique of the present invention for the three × nine embodiment shown in FIG. 3.

DETAILED DESCRIPTION

Figure 3:
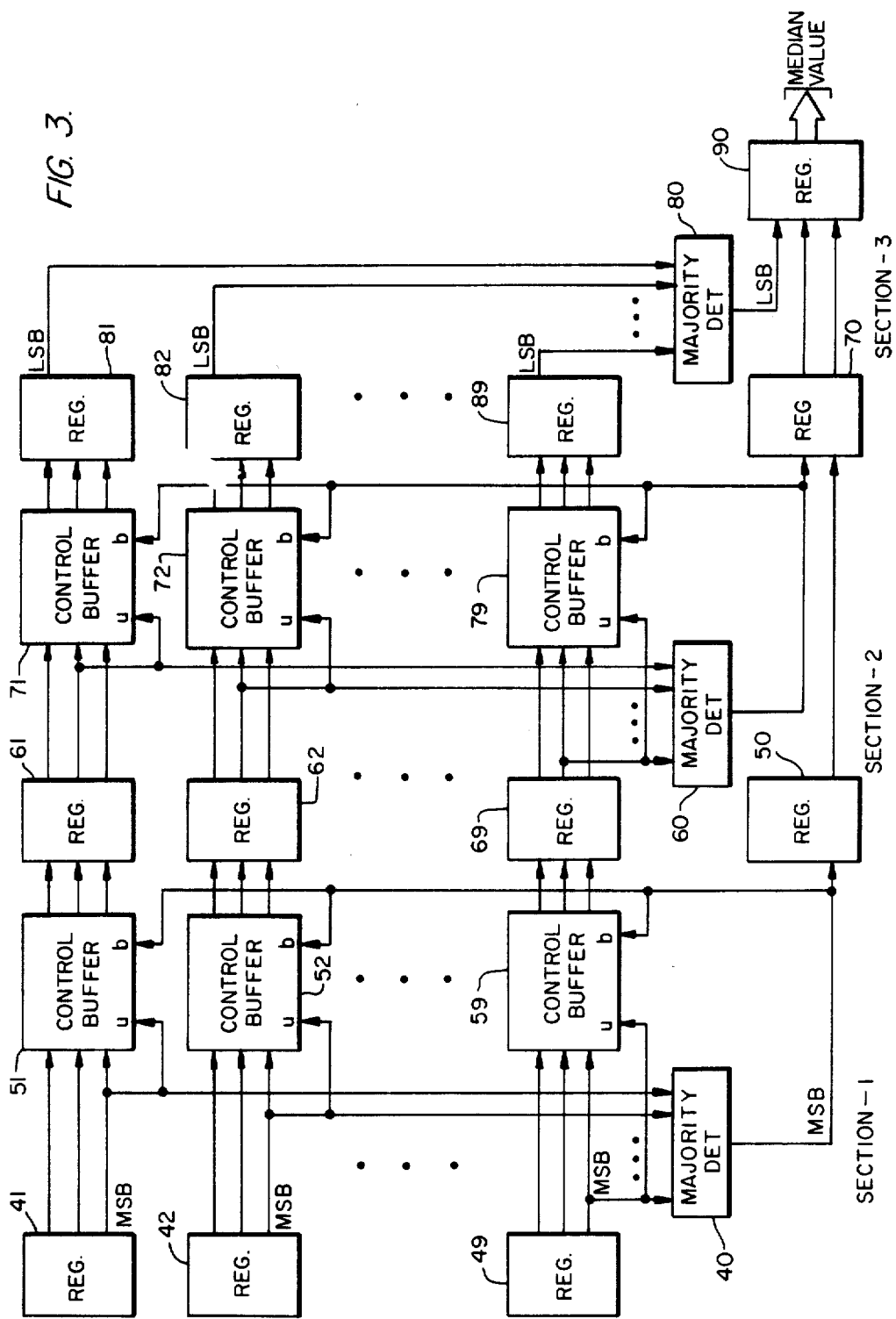
FIG. 3 shows the details of the median filter processing unit of the pipelined window arrangement of FIG. 2.

Before describing, in detail, the improved exact, real-time median filtering scheme according to the present invention, it should be observed that the invention resides primarily in a novel structural combination of conventional digital circuit components and not in the particular detailed configurations thereof. Accordingly the structure, control, and arrangement of these conventional digital processing circuits have been illustrated in the drawings by readily understandable block representations and schematic diagrams, which show only those specific details that are pertinent to the present invention, so as not to obscure the disclosure with structural details which will be readily apparent to those skilled in the art having the benefit of the description herein. Thus, the block diagram illustrations of the Figures do not necessarily represent the mechanical structural arrangement of the exemplary system, but are primarily intended to illustrate the major circuitry components of the system in a conventional functional grouping, whereby the present invention may be more readily understood.

As pointed out briefly above, the median filtering system of the present invention has particular utility for processing, in real-time, multi-dimensional imagery data. In order to distinguish a target from background within an image, within a real time frame, the present invention provides pipelined processing of a selected window portion of the image of interest. Before describing the application of the filtering scheme of the present invention to a window of imagery data, the basic signal processing scheme in accordance with which the median filter operates will be explained. For the purpose of facilitating an understanding of this scheme, an abbreviated data packet comprised of five three-bit data signal values, the median of which is to be extracted, will be analyzed from a standpoint of the operation of the median filter of the present invention.

FIG. 1 illustrates such a set of five three-bit signal values, the original data being shown in the left hand portion of FIG. 1 beneath the heading ORIGINAL DATA. These original data values are shown in column-tabulated form, with the most significant bit of each original three-bit code being enclosed in a rectangle. According to the median filtering processing scheme of the present invention, each of the multibit data code values of interest is examined on a bit-by-bit basis, beginning with the most significant bit position of each data value and proceeding through each successive bit position to the least significant bit position for each data code of interest. A majority decision for each bit of interest is made and the entirety of each code is then selectively modified according to whether or not the bit of interest for a respective code agrees with the majority decision.

More specifically, looking at the original data set shown in FIG. 1, examining the most significant bit for each of the five three-bit codes, it can be seen that there are three zero bits and two one-bits. Thus, the majority of the bits for these five three-bit code values is a zero. By virtue of this decision, the filtering scheme according to the present invention automatically decides that the median value to be of eventually determined must have a zero bit in its most significant bit position. This means that the median value is one of the three codes 010, 000, and 001. The two numbers that have been eliminated, namely those numbers having a one in the most significant bit position, are greater than the median value and the entirety of each of these codes is changed to a value to put them at the upper end of the range and out of consideration. For this purpose, each code whose most significant bit is a one, namely that which disagrees with the majority decision for the most significant bit position, is converted to all ones, so that the remaining codes are those shown for the first change illustrated in FIG. 1. This means that the remaining codes of interest are 010, 000, 001, 111, and 111. The majority decision of a zero bit for the most significant bit of the eventually to be determined median value is estalished at zero as shown in FIG. 1.

Having considered the most significant bit position, we now proceed to the middle or second bit position (shown enclosed by a rectange beneath the heading FIRST CHANGE) and carry out a similar majority decision process. For this decision, it can be seen that there are more ones than zeroes, so that the majority decision of the desired median code is a one. Any code that has a zero in the second bit position must be less than the median value and these codes are converted to values at the other end of the range, namely all zeroes. This means that the remaining set of codes, after the second change is: 010, 000, 000, 111, and 111, as shown for the second change in FIG. 1.

Looking now finally at the third or least significant bit position (enclosed by a rectangle beneath the heading SECOND CHANGE), it can be seen the majority decision reveals a greater number of zeroes than ones. This means that the last bit position of the median value is a zero. The resulting median value is therefore the code 010, which value was obtained by keeping a vector of constant size without any extraneous tabulation.

It is to be noted that the data being processed is in digital form, here a binary representation being employed for the various codes, so that the resulting median value will not necessarily be exactly equal to the average decimal value or other numerical reference value.

The signal processing scenario represented by the simplified illustration shown in FIG. 1 is a modification of a radix method described in an article by E. Ataman et al entitled "A Fast Method for Real-Time Median Filtering" described in the IEEE Transaction on Accoustics, Speech, Signal Processing, Volume ASSP-28, pages 415–420, Aug. 1980. In that article, the authors describe their method as based upon the binary representation of elements in the set $x_i$ and subsequently recognizing the various bits in the word. Letting the binary representation of $x_i$ be $b_1{}^i, b_2{}^i, \ldots b_L{}^i$ and that of the median M [x(n)] be $(U_1, U_2, U_3 \ldots U_L)$, the signal processing scenario for determining the median begins by dividing the elements of the set $\{x_i, 1 \leq i \leq n\}$ into two groups. The first group contains all the elements of the set for which $b_1{}^i$ is one and the second group the rest of the elements. If a majority of $b_1{}^i, i=1 \ldots n$ are equal to 1(0), then $U_1 = 1(0)$. This determines the first bit of the median. If $U_1 = 1$, then the median M is an element of the set of those elements which have $b_1{}^i = 1$, e.g. set $S(b_1{}^i = 1)$. Letting the cardinality of this set be C, then, if all $b_1{}^i = 1$, i.e. $S(b_1{}^i = 1) = \{x_i, 1 \leq i \leq n\}$, then M is also the median of the set $S(b_1{}^i = 1)$. If some $b_1{}^i = 0$, then M is the $t^{th}$ largest element of set $S(b_1{}^i = 1)$ when $t = (n+1)/2$. If a majority of the $b_1{}^i = 0$, then the median M is an element of the set $S(b_1 i = 0)$ and is the $(t-C)^{th}$ largest element of this set. Assuming, without loss of generality, that median M is an element of the set $S(b_1{}^i = 1)$, then the signal processing scenario proceeds by operating on set $S(b_1{}^i = 1)$ and subdividing the set based upon $b_2{}^i$ being 1 or 0. This search leads to a "tree" structure as described in an article by E. Ataman et al entitled "Median Filtering" 17th Allerton Conference, Monticello, Illinois October 1979.

In order to precisely implement the signal processing operation described above, one would have to keep track of the data tree along with T(t−C). Unfortunately, a processor cannot be used for this purpose due to speed constraints (on the order of 100 nanoseconds).

In accordance with the present invention, however, a modification of the radix method described above is employed, as explained briefly above in conjunction with the description of FIG. 1 and as detailed more specifically below. After examining a particular bit of each pixel of the window for the imagery data of interest, a decision is made on whether to modify the windowed data before looking to the next bit position. This alteration or conversion of the data makes it unnecessary to keep track of a tree structure, since the group of data remains the same size as each bit is examined. It is also unnecessary to keep track of the values t or C.

Referring now to FIG. 2, there is shown a pipelined arrangement of pixel registers 11-33 the respective contents of which are coupled to a median filter processing unit 15, shown in greater detail in FIG. 3, to be discussed below. (Pipelined processing, per se, is well known and attention may be directed to the U.S. patents to Sternberg U.S. Pat. Nos. 4,322,716 and 4,174,514 and Steinberg et al. 4,301,443, for exemplary illustrations of the application of such processing schemes for imagery data.) For purposes of the present description, it will be assumed that each pixel has been quantized to one of eight signal levels, represented by three data bits, as shown. It should be observed, however, that the present invention is not so limited and is applicable to any signal resolution capability sought. For example, off-the-shelf components for digital processing circuitry commonly employ eight or sixteen bit data values. The three-bit value chosen here is simply for the purpose of permitting an illustrative example of the present invention and a full understanding of how it operates on actual code values.

The incoming data is applied to a shift register line buffer 34 by way of which it is applied to a first pipelined group of registers 31-33 and then serially routed through successive stages via shift register line buffer 24, registers 21-23, shift register line buffer 14 and registers 11-13, as shown.

The binary code values within each of register units 11-33 correspond to the values of a three x three pixel window chosen here for purposes of explaining the invention. The pixel codes themselves are coupled from these registers to the median filter processing unit 15, shown in greater detail in FIG. 3.

Referring to FIG. 3, the median filter processing unit is comprised of a set of n sections, where n is the number of bits per pixel, (three in the example chosen). Thus, the median filter processing unit contains sections 1, 2 and 3, coupled in cascade. Each section is comprised of a set of m registers, where m is the window size, (a three x three window yielding nine pipelined stages). The pixel values within the respective stages 11-33 of the window shown in FIG. 2 are coupled to registers 41-49 of the median filter processing unit shown in FIG. 3. Each of these registers stores a respective one of three bit codes for the pixels stored in the pipelined window of FIG. 2, the respective bit positions being coupled over output lines of each register to a downstream section. Thus, the three-bit contents of register 41 are coupled to a control buffer 51 of downstream section 2.

Section 2 comprises m (or 9 in the example given) control buffers 51-59, each of which is controlled so as to pass the contents on its input lines to its output, or to modify those contents depending upon the output of a controlling majority detector within the preceding stage. Namely, each of control buffers 51-59 selectively passes the outputs of registers 41-49 to its own associated registers 61-69 depending upon a signal at the output of majority detector 40.

Majority detector 40 has a plurality of inputs coupled to a respective MSB of the bit lines for each respective register 41-49 and determines which bit among those values represents the majority. This majority decision output is coupled to register 50 in section-2 and is used as a control signal for the control buffers 51-59, as explained above.

Similarly, section-2 also contains its own majority detector 60 coupled to a different one of the bit lines for each of registers 61-69 and supplies an output to a downstream register 70 in section-3, which also receives the contents of register 50, and to each of a set of control buffers 71-79 in the third section of the median filter. Control buffers 71-79 are identical to control buffers 51-59 and are coupled to respective output registers 81-89. Output registers 81-89, for the three pixel bit configuration of interest, supply at their outputs either modified or unaltered versions of the original least significant bit for each pixel within the pipelined stages 11-33 of FIG. 2. These lines are coupled to a majority detector 80 which determines the majority bit for the least significant bit and couples this bit to a downstream register 90 which also receives the contents of the register 70. The contents of register 90 correspond to the median value, representative of data, absent of background noise or clutter (in a window section of imagery data) in the data values stored in the pipelined register sections 11-33.

FIG. 4 shows a table representing the operations of each of majority detectors 40, 60 and 80. Each of these devices is comprised of straightforward combinational logic and produces a one at its output when the number of ones on its input lines exceeds the number of zeroes and produces a zero at its output when the number of zeroes exceeds the number or ones.

FIG. 5 is a table of the operation of each of control buffers 51-59 and 71-79. Like the majority detector circuits, each of the control buffers is comprised of combinational logic, together with associated buffer circuitry, for either modifying the data applied to its inputs from a register in an upstream section, or coupling those data values as is to its associated output register.

FIG. 6 shows a flow chart of the operation of the median filter processing circuitry shown in FIG. 3, while FIG. 7 illustrates the unaltered and modified code values for the respective registers within the successive sections 1-3 as originally obtained from the pipelined window of FIG. 2, in a manner similar to the simplified explanation of the filtering scheme according to the present invention described above with reference to FIG. 1. In the explanation to follow attention is directed to FIGS. 3-7 for an understanding of the manner of operation of the median filter according to the invention. It is to be observed that timing signal lines for the successive units of FIG. 3 have been eliminated in order not to clutter the drawings. The clock signal lines that are employed to operate the successive sections and to shift the data from one section to another are selected to interface with the timing control section of the data processor circuitry employed for the eventual imagery analysis. All that is essentially required for the purposes of an appreciation of the present invention is an understanding of the signal processing scenario as employed in the hardware shown in FIG. 3, which scenario itself is illustrated in detail in the flow chart of FIG. 6.

Referring again to the above-referenced Figures, let it be initially assumed that the contents of the pipelined window stages 11–33 shown in FIG. 2 are coupled to registers 41–49, register 41 containing the contents of pipelined window register 33, while register 49 contains the contents of pipelined window register 11. This is shown for the respective nine stages of each section in FIG. 7. In FIG. 6 the initial point in the filtering process begins at START or entry point 101. The bit position indicated in step 102 starts the process at the MSB or bit position number 1 of the set of values stored in registers 41–49. Then proceeding through coupling point 103, steps 104–107 are carried out. More specifically, the most significant bit line of each of registers 41–49 is coupled to majority detector 40 which observes that there is a greater number of zeroes than ones for the most significant bit position of the pixel data for the 3×3 window of interest (steps 104, 105). Thus, the majority detector 40 produces a zero at its output in accordance with the table shown in FIG. 4, and this zero is stored in register 50 as the most significant bit of the median code value to be eventually obtained (step 106).

Next, passing through coupling point 111, and decision 112 which notes that the signal processing scenario has not reached the LSB of the three bit codes being analyzed, the process proceeds through steps 113–115. Namely, according to the control table illustrated in FIG. 5, each control buffer transfers the code values at its inputs to register 61–69, without alteration for codes whose most significant bit is a zero, matching that of the majority decision from detector 40, but alters the entirety of each code where the most significant bit has disagreed with the majority decision, namely the most significant bit is a one. This latter conversion takes place for stages 4, 5 and 6 in FIG. 7.

At step 117, the window bit position is advanced to the middle bit position within the three-bit pixel code and the scenario shown in FIG. 6 is repeated. Thus, majority detector 60 carries out steps 104–107, with resulting majority decision, here a one for the middle bit position, being stored in register 70 at step 107.

At step 112, a decision is again made as to whether or not the last bit position, the least significant bit position has been reached. Since the answer is negative, each of control buffers 71–79 in section-3 modifies the contents of those three-bit codes whose middle bit position differed from the majority decision carried out by majority detector 60. This results in the previously unmodified codes for stages 1 and 3 being converted to all zeroes. The code for stage number 7 is also converted to zeroes; however, in this instance since its value is previously all zeroes, there is no resulting change.

The process now proceeds through step 117 to increment the bit position to the LSB and proceeds to step 104, whereat majority detector 80 determines which bit occurs the majority of times in the least significant bit position of the codes currently stored in registers 81–89. This value is a one, so that the least significant bit position is a one, thereby completing with the median value three bit code stored in register 90 at step 107. Then in step 112, since the least significant bit position has been reached, the contents of the bit position indicator correspond to that of the number of bits in the pixel codes (i.e. N=3) and the signal processing scenario shown in FIG. 6 exits at STOP 120.

Using the pipelined architecture and median filter processing circuitry described above, the present invention is capable of handling video rates of $10 \times 10^6$ pixels per second. As explained above, the signal processing scheme is straight forward, using conventional logic circuits, with each section being substantially identically, thereby enhancing the modularity of the system and making it readily adaptable to present day hardware implementations.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. A signal processing apparatus for processing a plurality of multi component information signals to produce therefrom a multi component output signal representative of the median value of said plurality of multi component information signals comprising:

a multiplicity N of signal component processing sections each of which comprises:

a plurality of storage register means each of which stores the multiple components of a respective information signal; and a majority decision circuit, coupled to receive a prescribed one of the componets of each information signal stored in said plurality of storage register means and producing an output signal component representative of the majority of the prescribed ones of the components of each information signal coupled thereto from said storage register means; and wherein each of the first through $(N-1)^{th}$ processing sections further includes a plurality of control buffer means each of which is coupled to receive the components of a respective information signal stored in a respective one of said plurality of storage register means, and is controlled by the output of the majority decision circuit of that signal processing section to selectively modify the components of the information signal received thereby and couples the selectively modified components to a respective storage register means of the next succeeding stage; and output register means for storing the output signal components produced by the majority decision circuits of said multiplicity N of processing sections as said multi component output signal.

2. A signal processing apparatus according to claim 1, wherein each of said control buffer means includes means for causing each of the components of the signal received thereby to have a prescribed signal value in response to the value of the prescribed one of the components of the information signal stored in its associated storage register means differing from the value of the output signal component produced by the majority decision circuit of that signal processing section.

3. A signal processing apparatus according to claim 1, wherein each of said information signals corresponds to an n-bit digital word and the components of each information signal correspond to the respective bit positions thereof.

4. A signal processing apparatus according to claim 3, wherein the first processing section is associated with the most significant bit position of said n-bit digital word, while the $N^{th}$ processing section is associated with the least significant bit position of said n-bit digital word.

5. A signal processing apparatus according to claim 3, wherein each of said control buffer means includes means for causing each of the bit positions of the n-bit digital word received thereby to have a binary value opposite to that of the output bit value produced by the majority decision circuit in response to the value of the prescribed bit of the n-bit digital word received from its associated storage register means differing from the output bit value produced by the majority decision circuit.

6. A signal processing apparatus according to claim 1, wherein said multi component information signals are representative of imagery data and wherein said apparatus further includes a plurality of pipelined storage registers in respective ones of which said imagery data representative information signals are stored, the contents of respective ones of said pipelined storage registers being coupled to respective ones of said storage register means.

7. A signal processing apparatus according to claim 1, wherein each of said control buffer means includes means for causing each of the components received thereby to be coupled to a respective storage register means of the next succeeding processing section in response to the value of the prescribed one of the components of the information signal stored in its associated register means being the same as the value of the output signal component produced by the majority decision circuit of that signal processing section.

8. A signal processing apparatus according to claim 3, wherein each of said control buffer means includes means for causing each of the bit positions of the n-bit digital word received thereby to be coupled to a respective storage register means of the next succeeding processing section in response to the binary value of the prescribed bit of the n-bit digital word received from its associated storage register means being the same binary value as that of the output bit value produced by the majority decision circuit of that signal processing section.

* * * * *